(12) United States Patent
Holmes et al.

(10) Patent No.: US 7,883,829 B2
(45) Date of Patent: Feb. 8, 2011

(54) LITHOGRAPHY FOR PITCH REDUCTION

(75) Inventors: Steven J. Holmes, Guilderland, NY (US); Xuefeng Hua, Guilderland, NY (US); Willard E. Conley, Schenectady, NY (US)

(73) Assignees: International Business Machines Corporation, Armonk, NY (US); Freescale Semiconductors, Inc., Austin, TX (US)

( * ) Notice: Subject to any disclaimer, the term of this patent is extended or adjusted under 35 U.S.C. 154(b) by 235 days.

(21) Appl. No.: 12/184,438

(22) Filed: Aug. 1, 2008

(65) Prior Publication Data

US 2010/0028801 A1 Feb. 4, 2010

(51) Int. Cl.
G03F 7/00 (2006.01)
G03F 7/20 (2006.01)
G03F 7/40 (2006.01)

(52) U.S. Cl. .............. 430/270.1; 430/311; 430/312; 430/314; 430/317; 430/322

(58) Field of Classification Search .......... 430/270.1, 430/311, 312, 314, 317, 322
See application file for complete search history.

(56) References Cited

U.S. PATENT DOCUMENTS

| | | | |
|---|---|---|---|
| 6,916,746 B1 * | 7/2005 | Hudson et al. .......... 438/706 |
| 7,572,572 B2 * | 8/2009 | Wells ..................... 430/311 |
| 2002/0182874 A1 * | 12/2002 | Wang ..................... 438/706 |
| 2004/0087139 A1 * | 5/2004 | Yeh et al. ................ 438/636 |
| 2005/0121750 A1 * | 6/2005 | Chan et al. .............. 257/643 |
| 2008/0008969 A1 * | 1/2008 | Zhou et al. .............. 430/313 |
| 2009/0035665 A1 * | 2/2009 | Tran ........................ 430/5 |
| 2009/0081563 A1 * | 3/2009 | Wang et al. ................ 430/5 |
| 2009/0117492 A1 * | 5/2009 | Lee ........................ 430/313 |
| 2009/0117742 A1 * | 5/2009 | Jung ...................... 438/694 |
| 2009/0148796 A1 * | 6/2009 | Van Der Heijden et al. . 430/323 |
| 2009/0181330 A1 * | 7/2009 | Gabor et al. ............ 430/322 |

* cited by examiner

*Primary Examiner*—Amanda C. Walke
(74) *Attorney, Agent, or Firm*—Scully, Scott, Murphy & Presser, P.C.; Yuanmin Cai

(57) ABSTRACT

In one embodiment, a photoresist is lithographically patterned to form an array of patterned photoresist portions having a pitch near twice a minimum feature size. Fluorine-containing polymer spacers are formed on sidewalls of the patterned photoresist portions. The pattern of the fluorine-containing polymer spacers is transferred into an underlying layer to form a pattern having a sublithographic pitch. In another embodiment, a first pattern in a first photoresist is transferred into a first ARC layer underneath to form first ARC portions. A planarizing second optically dense layer, a second ARC layer, and a second photoresist are applied over the first ARC portions. A second pattern in the second photoresist is transferred into the second ARC layer to form second ARC portions. The combination of the first ARC portions and second ARC portions function as an etch mask to pattern an underlying layer with a composite pattern having a sublithographic pitch.

25 Claims, 14 Drawing Sheets

LITHOGRAPHY FOR PITCH REDUCTION

FIELD OF THE INVENTION

The present invention relates to semiconductor processing methods, and particularly to methods for forming reduced pitch lithographic structures, and structures for effecting the same.

BACKGROUND OF THE INVENTION

Lithography is employed in semiconductor manufacturing to pattern features in a photoresist. A layer of photoresist is exposed to incident light, which may be deep-ultraviolet (DUV) radiation, mid-ultraviolet (MUV) radiation, or X-ray radiation. Alternately, the layer of photoresist may be exposed to energetic electron in e-beam lithography. The energy of the photons or electrons causes changes in chemical composition of exposed portions of the photoresist, for example, by cross-linkage, scission, side chain removal, etc. Pre-baking or post-baking of the photoresist may be employed to maximize the changes in the chemical properties of the exposed portion of the photoresist relative to unexposed portions of the photoresist.

The exposed photoresist is developed to remove one of the set of exposed portions of the photoresist and the set of unexposed portions of the photoresist relative to the other. The photoresist is classified as a positive photoresist or a negative photoresist depending on the nature of the chemical changes upon exposure. If the photoresist becomes chemically less stable upon exposure, the photoresist is a positive photoresist. If the photoresist becomes chemically more stable upon exposure, the photoresist is a negative photoresist. In case a positive photoresist is employed, the exposed portions of the positive photoresist are removed upon development. In case a negative photoresist is employed, the unexposed portions of the negative photoresist are removed upon development.

A developed photoresist comprises a lithographic pattern. The features of the lithographic pattern have dimensions that are the same as, or greater than, a "minimum feature size," which is also called a "critical dimension." The minimum feature size is a function of a lithography tool employed to form the lithographic pattern. The minimum feature size F that a projection system can print is given approximately by:

$$F = \beta \times \lambda / N_A,$$

where $\beta$ is a coefficient, or a process prefactor, that reflects tool specific efficiency of the lithography system and other process related factors, $\lambda$ is the wavelength of the light employed for radiation, and $N_A$ is the numerical aperture of the lens. Typically, the value of the coefficient $\beta$ is in the range of about 0.5.

While the minimum feature size is defined only in relation to a lithography tool and normally changes from generation to generation of semiconductor technology, it is understood that the minimum feature size, i.e., the critical dimension, is to be defined in relation to the best performance of lithography tools available at the time of semiconductor manufacturing. As of 2008, the minimum feature size for a line width is about 45 nm, and is expected to shrink in the future. Any dimension less than the lithographic minimum dimension is called a "sublithographic dimension." Any dimension equal to or greater than the minimum feature size is a lithographic dimension.

A pitch of a line and space structure includes the width of the line and the spacing of the space. The lithographic minimum pitch for a line and space structure, or the minimum pitch for the line and space structure that may be formed with a single layer of photoresist, a single exposure, and a single development, is about 100 nm as of 2008, and is expected to shrink in the future.

While developments are under way to provide high numerical aperture exposure systems and/or increase the coefficient $\beta$ to minimum feature size F, the rate of reduction of the minimum feature size F through such efforts is far slower than the rate of reduction of desired feature sizes for high performance of semiconductor devices. Further, obtaining light sources that provide reduced wavelength in the deep ultraviolet (DUV) or extreme ultraviolet (EUV) range turns out to be a difficult challenge. Currently, an adequate light source to enable printing of dimensions less than 45 nm is not commercially available.

The pattern in the developed photoresist is subsequently transferred into an underlying layer employing the developed photoresist and an etch mask. Thus, the dimensions of features that may be formed in a semiconductor structure are directly tied to the dimensions of features in the developed photoresist. The minimum pitch of a repetitive lithographic pattern is the twice the minimum feature size since each unit pattern includes a line and a space or a via hole and a surrounding spacer.

Prior art lithographic methods thus face a fundamental limitation in the pitch of the pattern that may be printed once the wavelength of a lithographic system is given. In other words, a minimum pitch is determined more or less by the wavelength of the lithographic system.

In view of the above, there exists a need to provide methods of forming features having a pitch that is less than a conventionally determined minimum pitch of a lithographic system.

Specifically, there exists a need to provide methods of forming features in which the pitch of the pattern is reduced below twice the minimum feature size.

SUMMARY OF THE INVENTION

The present invention addresses the needs described above by providing methods of doubling the pitch of a lithographic pattern from a conventionally determined minimum pitch based on the wavelength of a lithographic system.

In one embodiment, an optically dense layer is formed over an underlying layer. A photoresist is applied over the optically dense layer and lithographically patterned to form an array of patterned photoresist portions having a pitch near twice a minimum feature size. Polymer spacers are formed on sidewalls of the patterned photoresist portions. After removing the patterned photoresist portions, the pattern of the polymer spacers having a sublithographic pitch is transferred into the optically dense layer and the underlying layer. The polymer spacers may be fluorine-containing polymer spacers.

In another embodiment, a stack of a first optically dense layer, a first anti-reflective coating (ARC) layer, and a first photoresist are applied over an underlying layer. The first photoresist is patterned to form an array of patterned first photoresist portions having a pitch near twice a minimum feature size. The pattern is transferred into the first ARC layer and the first photoresist is removed. A planarizing second optically dense layer, a second ARC layer, and a second photoresist are applied over patterned first ARC portions. The second photoresist is patterned to form an array of patterned second photoresist portions having a pitch near twice the minimum feature size. The second ARC layer and the second optically dense layer are patterned underneath the patterned second photoresist portions. Once the first ARC portions are exposed, the combination of the first ARC portions and second ARC portions function as an etch mask to form a pattern having a sublithographic pitch in the underlying layer.

According to an aspect of the present invention, a method of forming a patterned structure is provided, which comprises:

applying and lithographically patterning a first photoresist on a substrate;

forming polymer spacers directly on sidewalls of the first photoresist after the lithographic patterning;

removing the first photoresist selective to the polymer spacers; and transferring a pattern of the polymer spacers into an underlying layer on the substrate by an etch.

The polymer spacers may be fluorine-containing polymer spacers. The fluorine-containing polymers pacers may be formed by:

conformally depositing a fluorine-containing polymer layer directly on the first photoresist; and forming fluorine-containing polymer spacers by an anisotropic etch of the fluorine-containing polymer layer.

In one embodiment, the method further comprises forming an optically dense layer directly on the underlying layer, wherein the first photoresist is applied directly on the optically dense layer.

In another embodiment, an array of first photoresist portions having a lithographic pitch is formed by the lithographic patterning of the first photoresist.

In yet another embodiment, the anisotropic etch is selective to the first photoresist.

In still another embodiment, the fluorine-containing polymer layer comprises fluorine at an atomic concentration from about 1% to about 50%, and wherein fluorine concentration in the first photoresist is less than 0.5%.

According to another aspect of the present invention, another method of forming a patterned structure is provided, which comprises:

forming an optically dense layer and a first stack of a first anti-reflective coating (ARC) layer and a first photoresist on a substrate;

lithographically patterning the first photoresist with a first pattern and transferring the first pattern into the first ARC layer by an etch;

forming a second stack of a second optically dense layer, a second ARC layer, and a second photoresist on the first ARC layer;

lithographically patterning the second photoresist with a second pattern and transferring the second pattern into the second ARC layer and the second optically dense layer; and transferring the first pattern and the second pattern into an underlying layer on the substrate employing the first ARC layer and the second ARC layer as an etch mask.

In one embodiment, the optically dense layer is formed directly on the underlying layer, and wherein the first ARC layer is formed directly on the optically dense layer.

In another embodiment, the first pattern is a pattern of a periodic array having a lithographic pitch.

In yet another embodiment, the method further comprises removing the first photoresist prior to the formation of the second stack.

In still another embodiment, the second optically dense layer is self-planarizing and covers an entirety of the first ARC layer having the first pattern.

According to yet another aspect of the present invention, a structure is provided, which comprises:

an optically dense layer located on a substrate; and an array of polymer spacers located directly on a top surface of the optically dense layer and having a sublithographic pitch, wherein twice the sublithographic pitch is a lithographic pitch.

The array of polymer spacers may be an array of fluorine-containing polymer spacers.

In one embodiment, the structure further comprises an array of patterned photoresist portions having the lithographic pitch.

In another embodiment, a top surface of the optically dense layer is exposed between each pair of neighboring polymer spacers.

In yet another embodiment, the sublithographic pitch is less than 100 nm.

According to still another aspect of the present invention, a structure is provided, which comprises:

an optically dense layer located on a substrate;

a first array of first anti-reflective coating (ARC) portions having a lithographic pitch and abutting a top surface of the optically dense layer; and a second array of stacks having the lithographic pitch and interlaced with the first array, wherein each of the stacks comprises a second ARC portion abutting the optically dense layer and an optically dense portion abutting a top surface of the second ARC portion.

In one embodiment, the first array and the second array are offset by one half of the lithographic pitch.

In another embodiment, the sublithographic pitch is less than 100 nm.

BRIEF DESCRIPTION OF THE DRAWINGS

FIG. 1 corresponds to a step after application of an optically dense layer 70L and a photoresist layer 80L.

FIG. 2 corresponds to a step after lithographic patterning of the photoresist layer 80L to form photoresist portions 80.

FIG. 3 corresponds to a step after a conformal deposition of a fluorine-containing polymer layer 90L.

FIG. 4 corresponds to a step after formation of an array of fluorine-containing polymer spacers 90.

FIG. 5 corresponds to a step after removal of the photoresist portions 80.

FIG. 6 corresponds to a step after formation of optically dense portions 70.

FIG. 7 corresponds to a step after transfer of the pattern in the optically dense portions 70 into an underlying layer 66 by an etch.

FIG. 8 corresponds to a step after formation of a first optically dense layer 170L, a first anti-reflective coating (ARC) layer 180L, and a first photoresist layer 182L.

FIG. 9 corresponds to a step after forming an array of stacks having a first pattern, in which each stack contains a first ARC portion 180 and a first photoresist portion 182.

FIG. 10 corresponds to a step after application of a second optically dense layer 190L and a second ARC layer 196L and formation of second photoresist portions 198 having a second pattern.

FIG. 11 corresponds to a step after formation of second ARC portions 196.

FIG. 12 corresponds to a step after transfer of the second pattern into the second ARC layer 190L to form second ARC portions.

FIG. 13 corresponds to a step after transfer of a composite pattern including the first and second patterns into the first optically dense layer 170.

FIG. 14 corresponds to a step after transfer of the composite pattern into an underlying layer 66 by an etch.

DETAILED DESCRIPTION OF THE INVENTION

Figure 1:
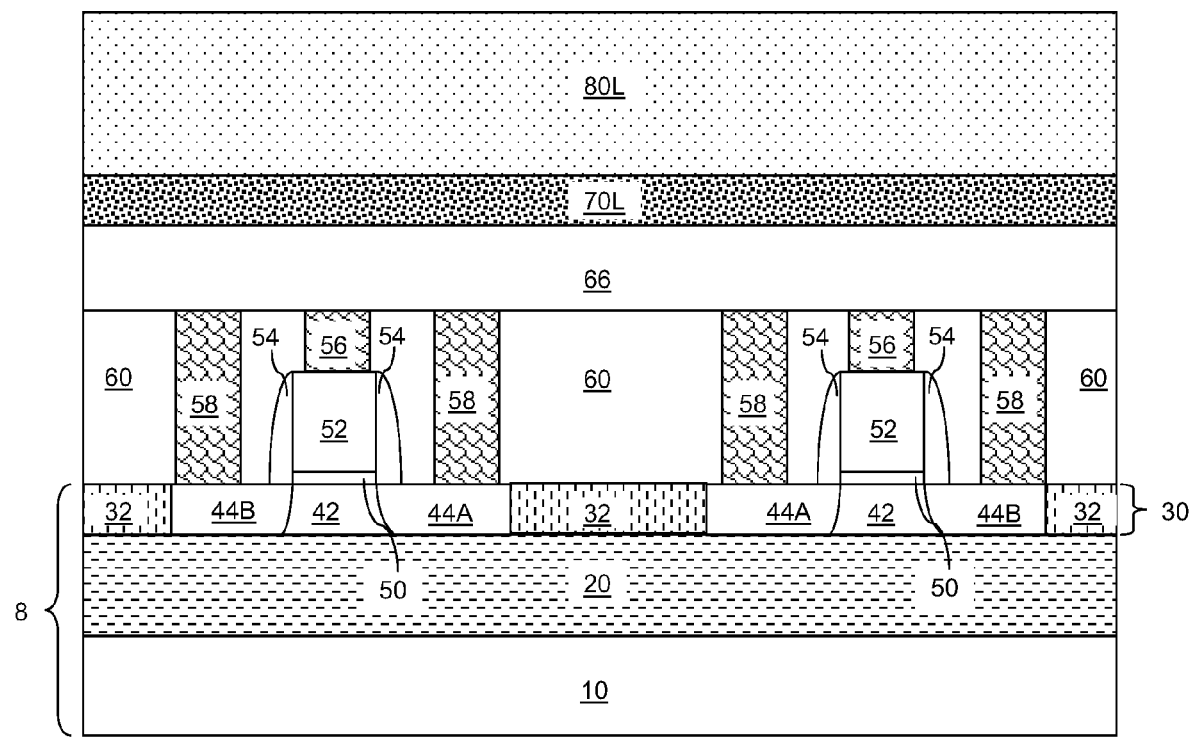
FIGS. 1-7 are sequential vertical cross-sections of a first exemplary structure according to the present invention.

As stated above, the present invention relates to methods for forming reduced pitch lithographic structures, and structures for effecting the same, which are now described in detail with accompanying figures. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIG. 1, a first exemplary lithographic structure according to a first embodiment of the present invention comprises a semiconductor structure including a semiconductor substrate 8, semiconductor device structures, an underlying layer 66, an optically dense layer 70L, and a photoresist layer 80. The semiconductor substrate 8 and the semiconductor device structure beneath the underlying layer 66 are shown only for the purposes of illustration. In general, the present invention may be employed on any substrate on which, or in which, an underlying layer is formed.

The semiconductor substrate 8 may be a semiconductor-on-insulator (SOI) substrate, which comprises a handle substrate 10, a buried insulator layer 20, and a top semiconductor layer 30. Alternately, the semiconductor substrate 8 may be a bulk substrate or a hybrid substrate having a bulk portion and a semiconductor-on-insulator portion. Semiconductor devices, which may be field effect transistors or any other semiconductor devices, may be formed in, or on, the semiconductor substrate 8. FIG. 1 shows two field effect transistors, each having a body region 42, a source region 44A, a drain region 44B, a gate dielectric 50, a gate electrode 52, and a gate spacer 54. At least one dielectric layer 60 may be formed over the semiconductor devices. Gate contact vias 56 and source and drain contact vias 58 may be formed on the gate electrodes 52 and source and drain regions (44A, 44B), respectively.

While the present invention is described with an underlying layer 66 located in a back-end-of-line (BEOL) structure, embodiments in which the underlying layer is located in a front-end-of-line (FEOL) structure or within a substrate are explicitly contemplated herein.

The underlying layer 66 may comprise a dielectric layer, a semiconductor layer, a conductive layer, or a stack thereof. In general, the underlying layer 66 may comprise any material that may be patterned employing an etch.

The optically dense layer 70L is formed on the underlying layer 66. Optical density is the degree of opacity of a translucent medium expressed by $\log I_0/I$, where $I_0$ is the intensity of the incident ray, and I is the intensity of the transmitted ray. The optically dense layer 70L has a high optical density, i.e., the intensity of the transmitted ray is significantly less than the intensity of the incident ray. While the measure of significance of reduction of the intensity of the transmitted ray relative to the intensity of the incident ray depends on the purposes of the application for the optically dense layer 70L, for the purposes of the present invention, the optically dense layer 70L provides reduction of the intensity of the transmitted ray to a level that is consistent with lithographic applications, i.e., the patterning of a photoresist layer 80 without undue influence of any optical properties of the underlying layer 66. Typically, the optically dense layer 70L is considered to be sufficiently optically dense for lithographic purposes if the optical density exceeds log 10, i.e., if the intensity of the transmitted ray is less than 10% of the intensity of the incident light.

Typically, the optically dense layer 70L is a hydrocarbon material layer, and may comprise an anti-reflective coating material used in the art. The optically dense layer 70L may comprise a hydrocarbon-based polymer. The thickness of the optically dense layer 70L may be from about 50 nm to about 600 nm, and typically from about 100 nm to about 300 nm, although lesser and greater thicknesses are explicitly contemplated herein also.

The photoresist layer 80L comprises an optically sensitive material. In one case, the photoresist layer 80L comprises a deep-ultraviolet (DUV) sensitive photoresist material. For example, the photoresist layer 80L may include polyhydroxystyrene-based polymers containing a photoacid generator, which changes the solubility to a developer solution upon exposure to deep ultra-violet (DUV) light. In this case, the photoresist layer 80L comprises an acrylate polymer system, which may be employed with a 193 nm lithography tool. Typically, the photoresist layer 80L does not comprise fluorine. In case the photoresist layer 80L comprises a small quantity of fluorine, the fluorine content is at an insignificant level that does not affect the property of the photoresist layer 80L in a significant manner. The fluorine content in the photoresist layer 80L in this case is less than 0.5% in atomic concentration. Alternately, the photoresist layer 80L may comprise a mid-ultraviolet (MUV) photoresist, an extreme ultraviolet (EUV) photoresist, or an X-ray photoresist.

The thickness of the photoresist layer 80L may be from about 50 nm to about 600 nm, and typically from about 100 nm to about 300 nm, although lesser and greater thicknesses are contemplated herein also. The photoresist layer 80L may be formed by spin-on coating or equivalent methods.

Figure 2:
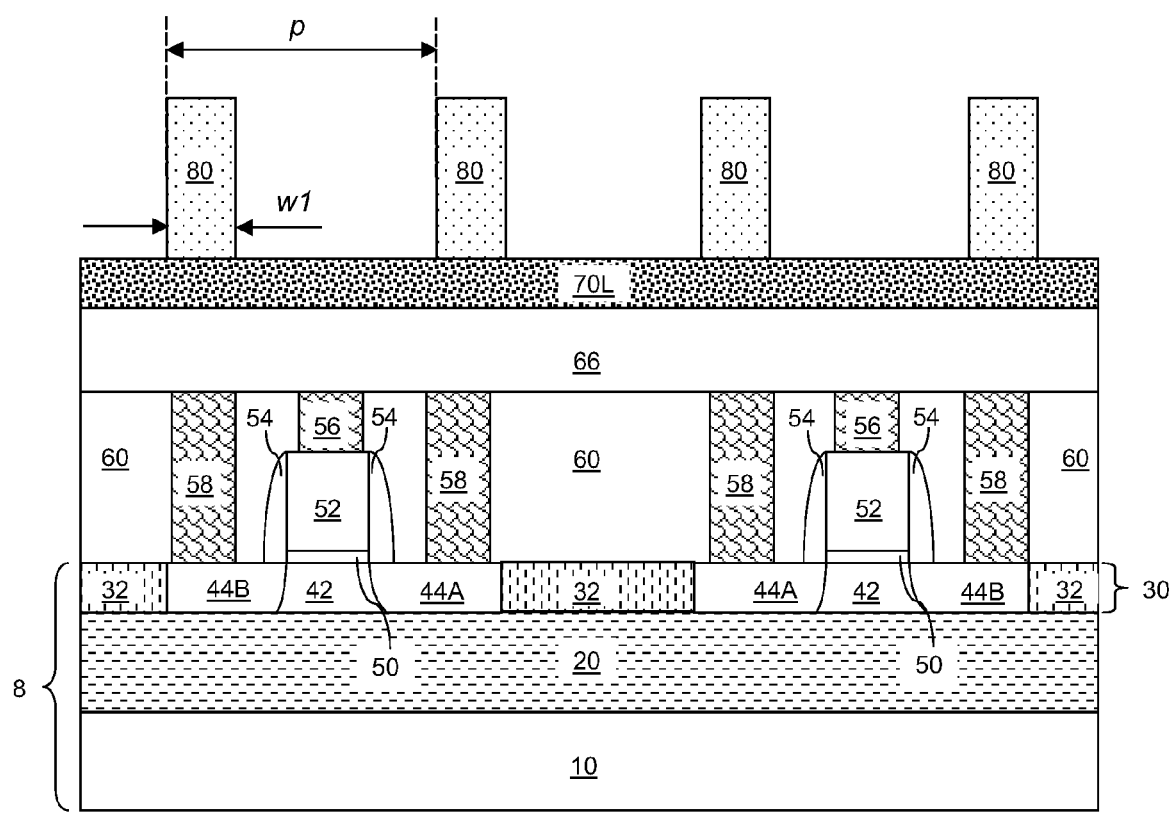

Referring to FIG. 2, the photoresist layer 80L is patterned by lithographic means, i.e., exposure and development, to form photoresist portions 80. The lithographic pattern may be a pattern of a periodic array, or may be an irregular pattern. Preferably, the lithographic pattern is a pattern of a regular periodic array. More preferably, the lithographic pattern is a pattern of one-dimensional array of lines and spaces having a lithographic pitch p, i.e., a pitch having a lithographic dimension. Preferably, overexposure or underexposure is employed so that the width of each photoresist portion 80, which is herein referred to as a first width w1, is less than one half of the lithographic pitch p.

The lithographic pitch p is a lithographic dimension, i.e., a dimension that may be formed by lithographic means. The lithographic pitch p is the same as, or greater than, the minimum lithographic pitch that may be obtained by commercially available lithography tools. For example, if ArF lithography employing 193 nm wavelength light is used, the lithographic pitch p is the same as, or greater than about 90 nm, which is the lithographic minimum pitch.

Figure 3:
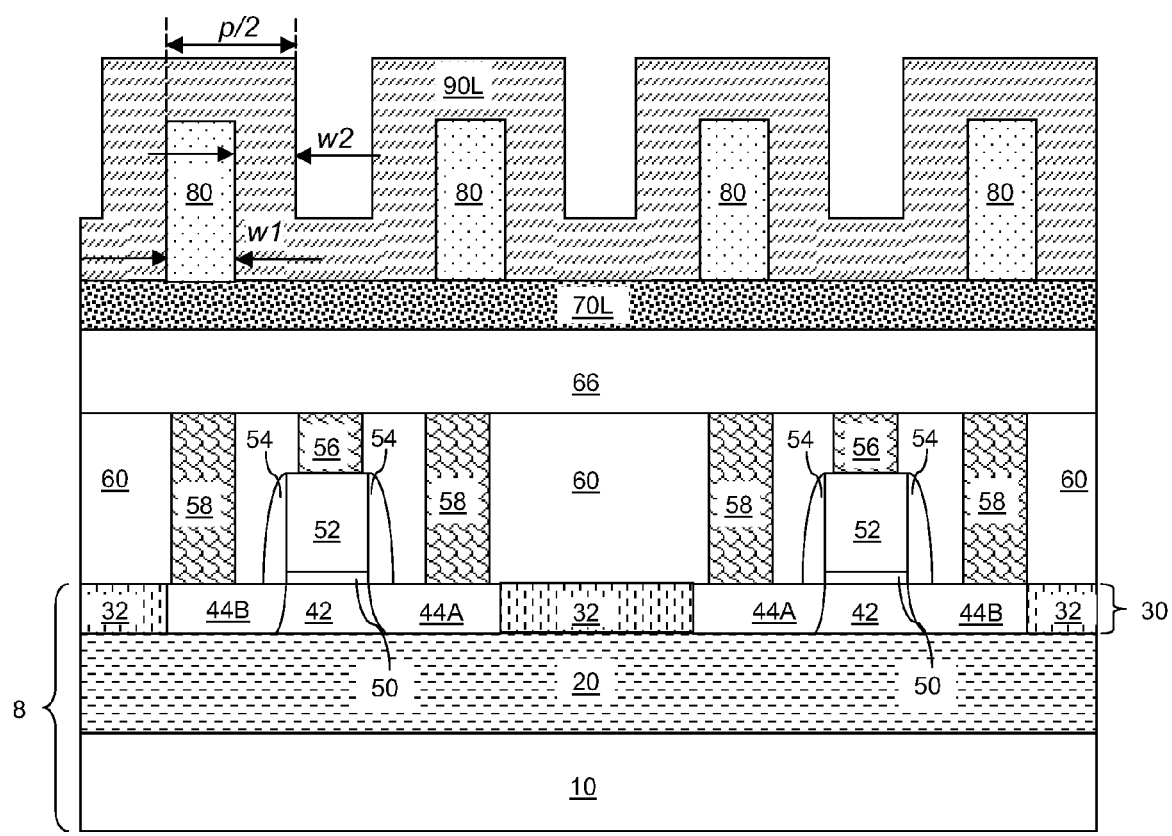

Referring to FIG. 3, a fluorine-containing polymer layer 90L is formed on the photoresist portions 80 and the optically dense layer 70L by a conformal deposition. The fluorine-containing polymer layer 90L is formed by conformal deposition, not by a self-planarizing process such as a spin-on coating that is typically employed for application of anti-reflective coating layer and photoresist layers.

Typically, the fluorine-containing polymer layer 90L is formed by chemical vapor deposition (CVD) in a process chamber, which is typically operated at a reduced pressure from about 1 mTorr to about 100 Torr. The first exemplary lithographic structure is placed within the process chamber and heated to an elevated temperature that is high enough to induce thermal decomposition of reaction precursors. The reaction precursors are flowed into the process chamber along with an inert carrier gas. The reaction precursors decompose or react with other reaction precursors to cause deposition of a fluorine-containing polymeric material on the surfaces of the photoresist portions 80 and the optically dense layer 70L. The reaction rate of the chemical vapor deposition process is not mass flow limited, but is temperature limited. The temperature of the first exemplary lithographic structure within the process chamber depends on the chemical species of the reaction precursors, the desired rate of deposition, and the desired level of conformity of the fluorine-containing polymer layer 90L. In one embodiment, the reaction is thermally induced without using plasma. In another embodiment, the rate of reaction is accelerated by employing plasma.

The fluorine-containing polymer layer 90L comprises a carbon-based polymer having fluorine at an atomic concentration from about 1% to about 50%, and preferably from about 5% to about 25%, although lesser and greater fluorine concentrations are explicitly contemplated herein also. The atomic fluorine concentration of the fluorine-containing polymer layer 90L is higher than the atomic fluorine concentration of the photoresist portions 80.

In one case, the lateral thickness of the fluorine-containing polymer layer 90L on the sidewalls of the photoresist portions 80 is substantially the same as the difference between half of the lithographic pitch p and the first width w1. The lateral thickness of the fluorine-containing polymer layer 90L is herein referred to as a second width w2. Thus, the second width w2 is substantially the same as the difference between half of the lithographic pitch p and the first width w1, i.e., $w2=p/2-w1$, and $w1+w2=p/2$. The thickness of the fluorine-containing polymer layer 90L over the top surfaces of the photoresist portions 80 and the optically dense layer 70L is substantially the same as the second width w2 since the fluorine-containing polymer layer 90L is conformal.

For example, if the lithographic pitch p is from about 90 nm to about 250 nm, one half of the lithographic pitch p, or the half-pitch p/2, is from about 45 nm to about 125 nm. The first width w1 may be from about 35 nm to about 120 nm, and the second width w2 may be from about 5 nm to about 120 nm, and preferably from about 10 nm to about 40 nm.

In another case, the lateral thickness of the fluorine-containing polymer layer 90L on the sidewalls of the photoresist portions 80 is greater than, or less than, the difference between half of the lithographic pitch p and the first width w1. Thus, the second width w2 is greater than, or less than, the difference between half of the lithographic pitch p and the first width w1, i.e., $w2>p/2-w1$, or $w2>p/2-w1$. The thickness of the fluorine-containing polymer layer 90L over the top surfaces of the photoresist portions 80 and the optically dense layer 70L is substantially the same as the second width w2 since the fluorine-containing polymer layer 90L is conformal.

Figure 4:
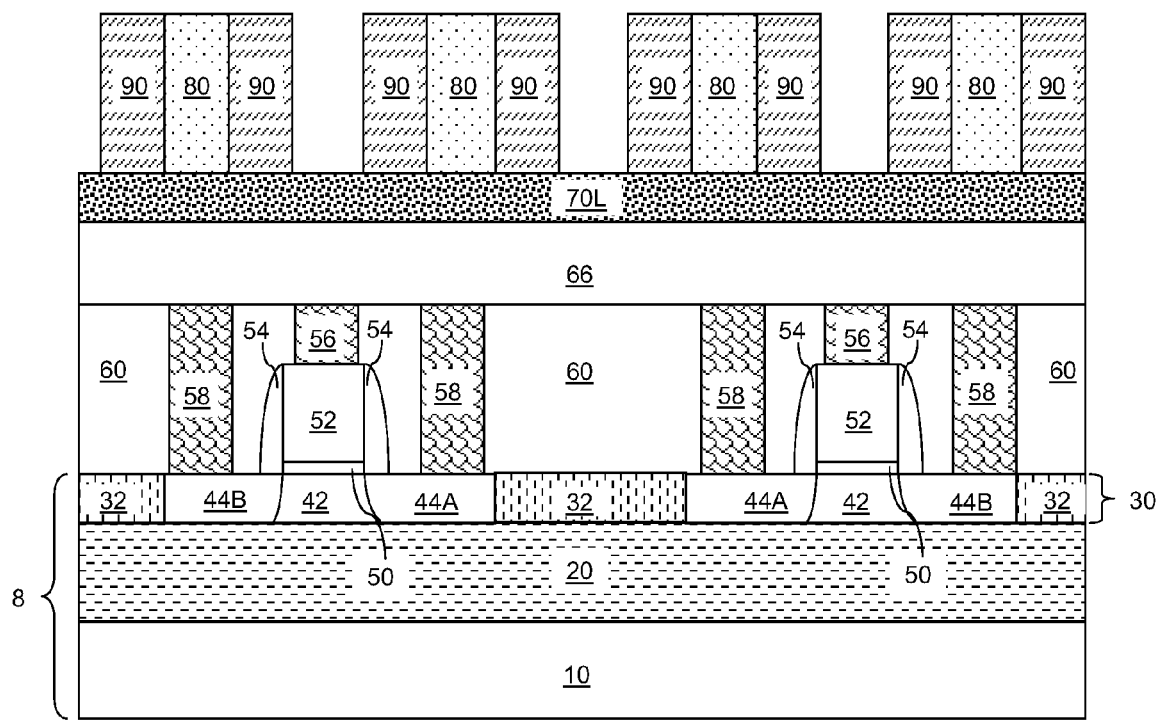

Referring to FIG. 4, an anisotropic etch is performed to remove horizontal portions of the fluorine-containing polymer layer 90L. The remaining portions of the fluorine-containing polymer layer 90L constitute fluorine-containing polymer spacers 90. Each of the fluorine-containing polymer spacers 90 is separated from a neighboring fluorine-containing polymer spacer by the first width w1 and from another neighboring fluorine-containing polymer spacer 90 by the difference between the half-pitch p/2 less the second width w2.

The anisotropic etch is selective to the optically dense layer 70L, i.e., does not etch the optically dense layer 70L in any substantial manner. Preferably, the anisotropic etch is also selective to the photoresist portions 80. This may be effected by employing an etch chemistry that provides a lower etch rate for a material containing a high atomic concentration of fluorine, i.e., the material of the fluorine containing polymer layer 90L, relative to a material containing a low concentration of fluorine, i.e., the material of the photoresist portions 80 since the atomic fluorine concentration of the fluorine-containing polymer layer 90L is higher than the atomic fluorine concentration of the photoresist portions 80 as described above. End pointing of the anisotropic etch may be based on detection of the exposure of the top surfaces of the photoresist portions 80 and/or the detection of the exposure of the optically dense layer. Alternately, the anisotropic etch may be timed if the etch rate of the fluorine-containing polymer layer 90L is known.

Figure 5:
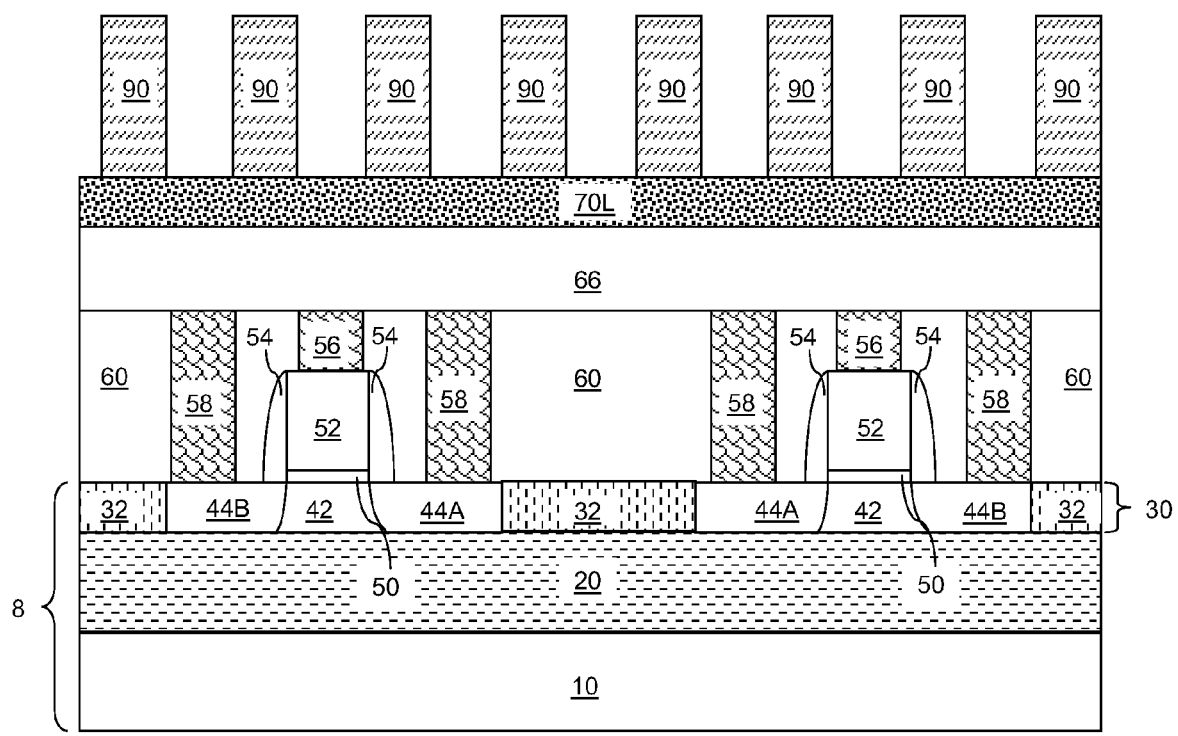

Referring to FIG. 5, the photoresist portions 80 are removed selective to the fluorine-containing polymer spacers 90. For example, an anisotropic etch that provides a fluorine concentration dependent etch rate so that the entirety of the photoresist portions 90L, which contains no fluorine or an insignificant amount of fluorine, is etched, while a substantial portion of each of the fluorine-containing polymer spacers 90 is preserved at the end of the anisotropic etch.

A top surface of the optically dense layer 70L is exposed between neighboring pairs of the fluorine-containing polymer spacers 90. The fluorine-containing polymer spacers 90 collectively constitute a periodic one-dimensional array, i.e., a periodic array running in one direction. In case the first width w1 is equal to the difference between the half-pitch p/2 less the second width w2, each pair of neighboring fluorine-containing polymer spacers 90 is separated by the same distance. Consequently, the array of the fluorine-containing polymer spacers 90 has a periodicity of the half-pitch p/2, i.e., one half of the lithographic pitch p. In case the first width w1 is equal to the difference between the half-pitch p/2 less the second width w2, the array of the fluorine-containing polymer spacers 90 has the lithographic pitch p, which is the pitch of the photoresist portions 80 in FIG. 2.

Figure 6:
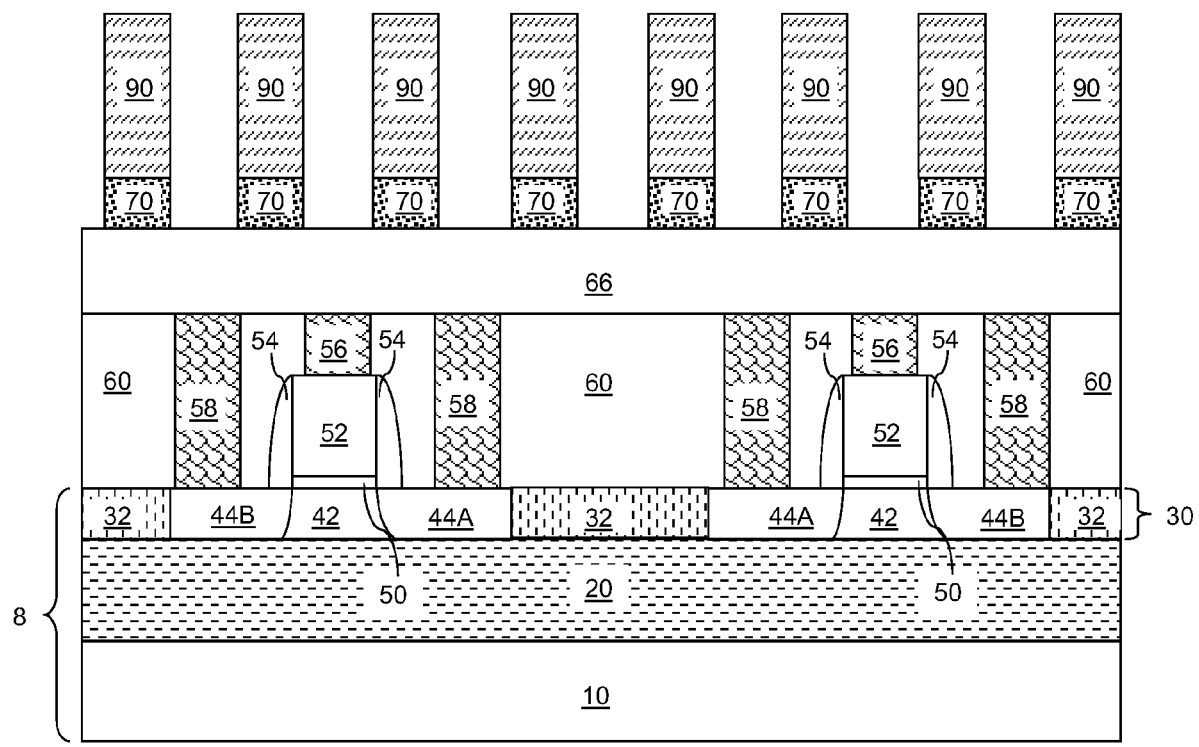

Referring to FIG. 6, the pattern in the array of the fluorine-containing polymer spacers 90 is transferred into the optically dense layer 70L to form an array of optically dense portions 70, which has the same periodicity as the array of the fluorine-containing polymer spacers 90. Some or all of the fluorine-containing polymer spacers 90 may be consumed during the transfer of the pattern to form the array of the optically dense portions 70. Typically, an anisotropic etch is employed for the pattern transfer from the array of the fluorine-containing polymer spacers 90 into the array of the optically dense portions 70.

Figure 7:
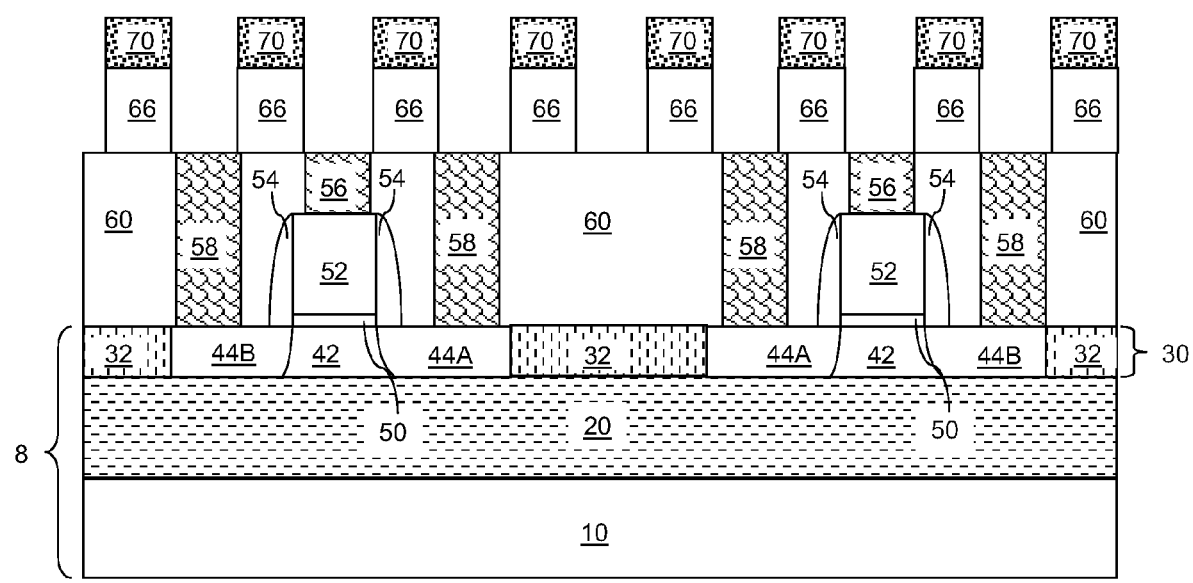

Referring to FIG. 7, the pattern in the array of the optically dense portions 70 is transferred into the underlying layer 66 by an etch, which is typically an anisotropic etch. The chemistry of the etch depends on the material of the underlying layer 66. Preferably, the etch chemistry has selectivity to the optically dense portions 70. Any remaining portions of the array of the fluorine-containing polymer spacers 90 are removed either during the etch or after the etch. The array of the optically dense portions 70 may thereafter be removed to expose patterned surfaces of the underlying layer 66, which may have a periodicity of one half of the lithographic pitch p or a periodicity of the lithographic pitch p.

In case the pattern in the underlying layer 66 has a periodicity of one half of the lithographic pitch p, the pitch of the pattern in the underlying layer 66 may be sub-lithographic, i.e., less than a lithographic minimum pitch. For example, if the lithographic pitch p of the photoresist portions 80 in FIG. 2 may be at least the lithographic minimum pitch and less than twice the lithographic minimum pitch, the pitch of the pattern in the underlying layer 66 is one half of the lithographic pitch p, which is less than the lithographic minimum pitch, i.e., a sub-lithographic pitch. Thus, a sub-lithographic pitch is obtained for the pattern in the underlying layer 66.

In case the second width w2 is different from the difference between half of the lithographic pitch p and the first width w1, the pattern in the underlying layer 66 contains an alternating sequence of wide spaces and narrow spaces separated by lines of a constant width. The width of the lines, the width of the wide spaces, and the width of the narrow spaces may be sub-lithographic if the lithographic pitch p of the photoresist portions 80 in FIG. 2 is at least the lithographic minimum pitch and less than twice the lithographic minimum pitch. Thus, a pattern having sub-lithographic features, i.e., features having dimensions that may not be printed by normal lithographic exposure and development processes, is formed in the underlying layer 60.

Figure 8:
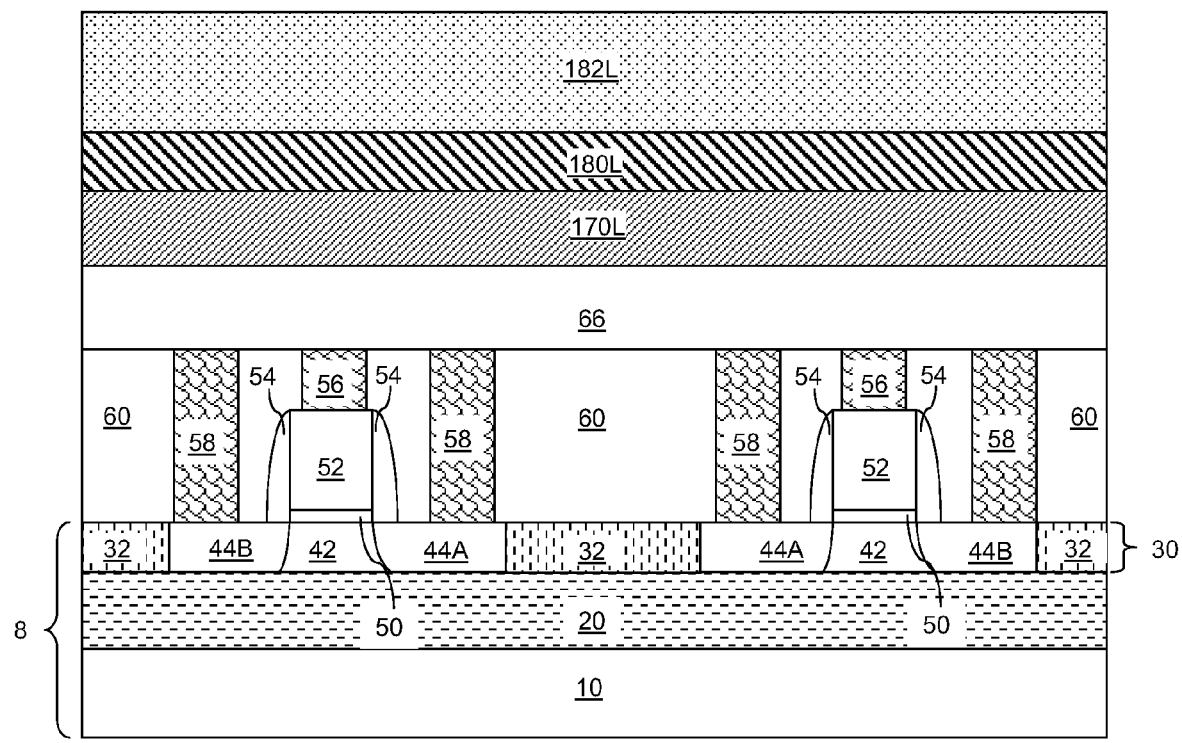
FIGS. 8-14 are sequential vertical cross-sections of a second exemplary structure according to the present invention.

Referring to FIG. 8, a second exemplary lithographic structure according to a second embodiment of the present invention comprises a semiconductor structure including a semiconductor substrate 8, semiconductor device structures, an underlying layer 66, a first optically dense layer 170L, and a first anti-reflective coating (ARC) layer 180L, and a first photoresist layer 180L. The semiconductor substrate 8 and the semiconductor device structure beneath the underlying layer 66 are shown only for the purposes of illustration. In general, the present invention may be employed on any substrate on which, or in which, an underlying layer is formed.

The semiconductor substrate 8 and the semiconductor device structures may be any such structures known in the art, and may be the same as in the first exemplary lithographic structure. The underlying layer 66 may comprise a dielectric layer, a semiconductor layer, a conductive layer, or a stack thereof. In general, the underlying layer 66 may comprise any material that may be patterned employing an etch.

The first optically dense layer 170L is formed on the underlying layer 66. The first optically dense layer 170L has a high optical density as the optically dense layer 70L in the first embodiment. Typically, the first optically dense layer 170L is a hydrocarbon material layer, and may comprise an anti-reflective coating material used in the art. The thickness of the first optically dense layer 170L may be from about 50 nm to about 600 nm, and typically from about 100 nm to about 300 nm, although lesser and greater thicknesses are explicitly contemplated herein also.

The first ARC layer 180L comprises an anti-reflective material. The first ARC layer 180L comprises a hydrocarbon based material having a different material composition than the first photoresist layer 182L. In one embodiment, the first ARC layer 180L comprises silicon at an atomic concentration from about 1% to about 50%, and typically from about 15% to about 43%. In another embodiment, the first ARC layer 180L comprises a refractory metal at an atomic concentration from about 1% to about 50%, and typically from about 8% to about 45%. The first ARC layer 180L controls reflectivity of the surface over which the first photoresist layer 182L is patterned by reducing standing waves and optical notching. The thickness of the first ARC layer 180L may be from about 15 nm to about 300 nm, and typically from about 30 nm to about 150 nm, although lesser and greater thicknesses are explicitly contemplated herein.

The first photoresist layer 182L comprises an optically sensitive material as the photoresist layer 80L in the first embodiment. The thickness of the first photoresist layer 182L may be from about 50 nm to about 300 nm, and typically from about 100 nm to about 200 nm, although lesser and greater thicknesses are contemplated herein also. The first photoresist layer 182L may be formed by spin-on coating or equivalent methods.

Figure 9:
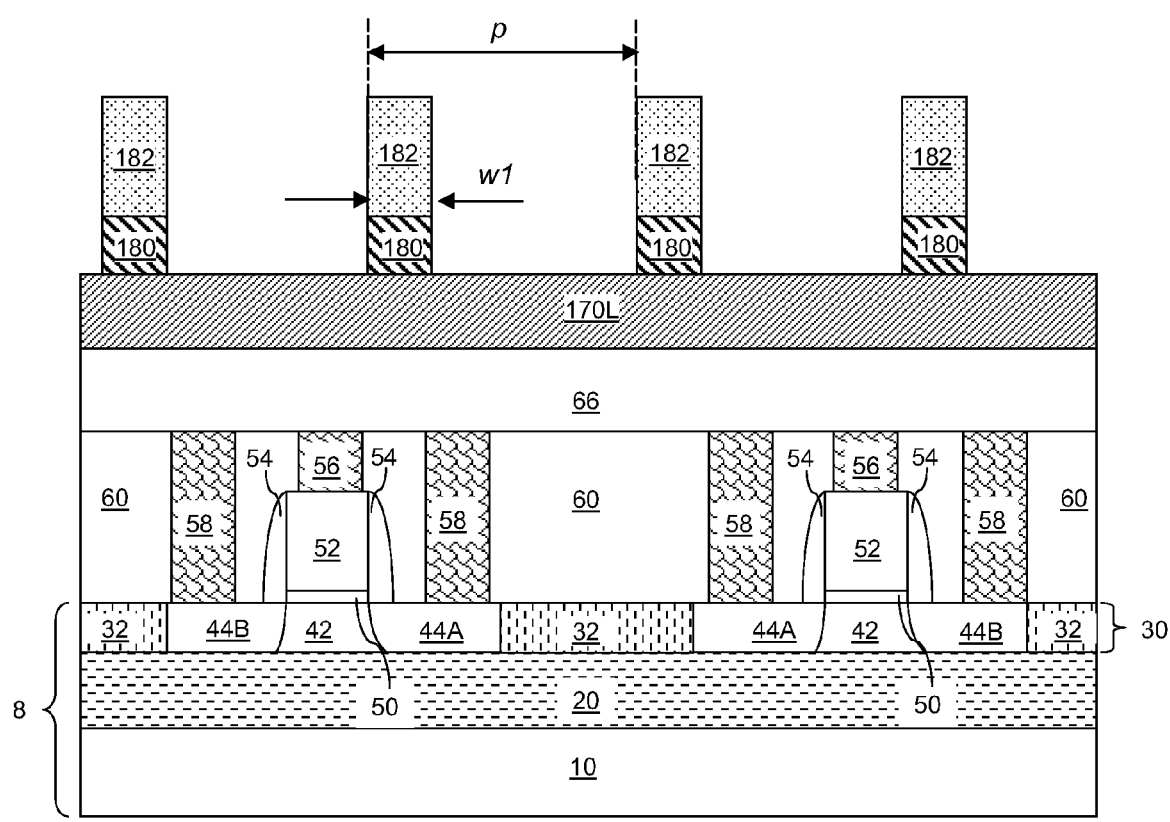

Referring to FIG. 9, the first photoresist layer 182L is patterned by lithographic means, i.e., exposure and development, to form first photoresist portions 182. The lithographic pattern may be a pattern of a periodic array, or may be an irregular pattern. Preferably, the lithographic pattern is a pattern of a regular periodic array. More preferably, the lithographic pattern is a pattern of one-dimensional array of lines and spaces having a lithographic pitch p, i.e., a pitch having a lithographic dimension. Preferably, overexposure or underexposure is employed so that the width of each first photoresist portion 182, which is herein referred to as a first width w1, is less than one half of the lithographic pitch p.

The lithographic pitch p is a lithographic dimension, i.e., a dimension that may be formed by lithographic means. The lithographic pitch p is the same as, or greater than, the minimum lithographic pitch that may be obtained by commercially available lithography tools. For example, if ArF lithography employing 193 nm wavelength light is used, the lithographic pitch p is the same as, or greater than about 90 nm, which is the lithographic minimum pitch.

The pattern of the first photoresist portions 182 is herein referred to as a first pattern. The first pattern is transferred into the first ARC layer 180L to form first ARC portions 180 by an anisotropic etch. Preferably, the anisotropic etch is selective to the first optically dense layer 170. The first ARC portions 180 collectively constitute a one-dimensional regular array having the lithographic pitch p. The width of each of the first ARC portions 180 is substantially the same as the first width w1. Some or all of the first photoresist portions 182 may be removed during the formation of the array of the first ARC portions 180.

Figure 10:
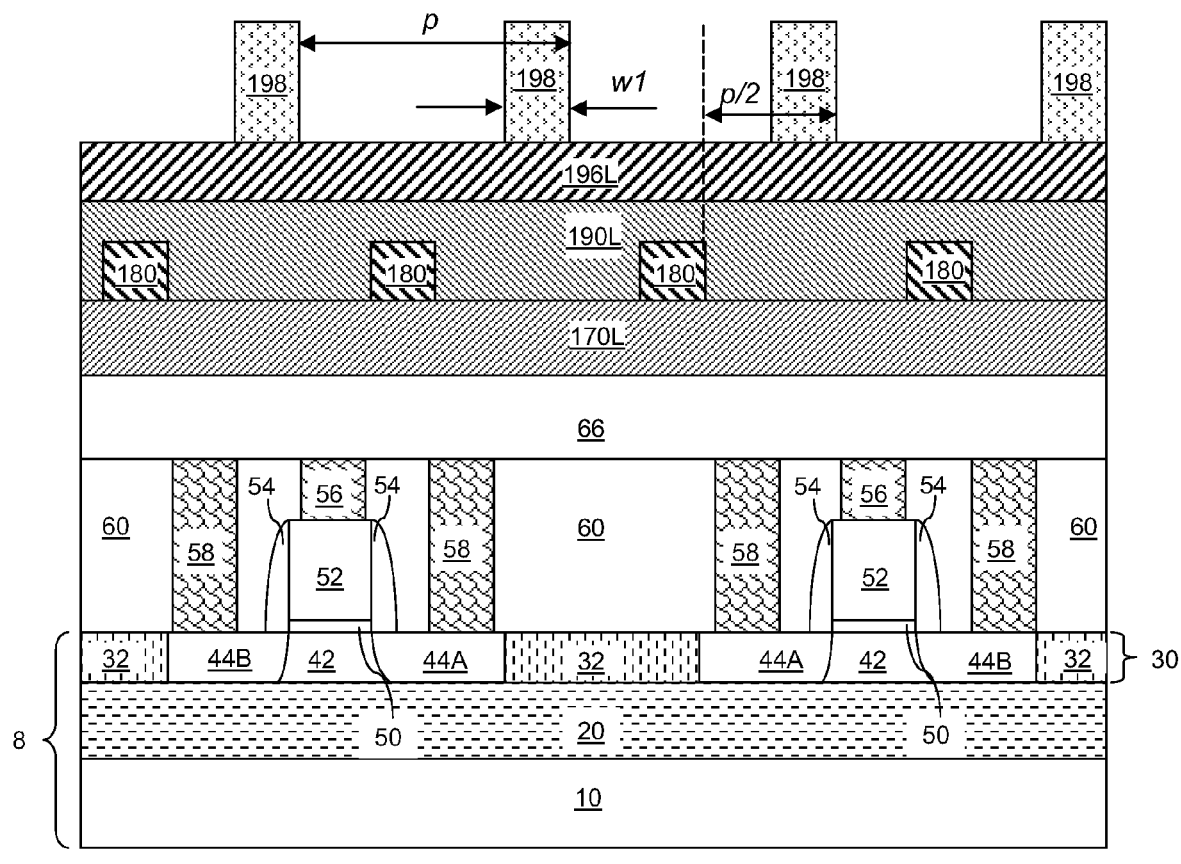

Referring to FIG. 10, any remaining portion of the first photoresist portions 182 is removed selective to the array of the first ARC portions 180 and the first optically dense layer 170. A second optically dense layer 190L is applied over the first optically dense layer 170L and the array of the first ARC portions 180. The second optically dense layer 190L comprises an optically dense material as the optically dense layer 70L in the first embodiment. The second optically dense layer 190L comprises a different material than the material of the first ARC portions 180. The material of the second optically dense layer 190L may be the same as, or different from, the material of the first optically dense layer 170.

The second optically dense layer 190L comprises a self-planarizing material, which may be applied by a spin-on coating. The thickness of the second optically dense layer 190L, as measured from the top surface of the first optically dense layer 170L between a neighboring pair of first ARC portions, is greater than the thickness of the first ARC portions 180 so that the entirety of the first ARC portions is covered by the second optically dense layer 190. The thickness of the second optically dense layer 190L may be from about 100 nm to about 600 nm, and typically from about 150 nm to about 300 nm, although lesser and greater thicknesses are contemplated herein also.

A second anti-reflective coating (ARC) layer 196L is applied over the second optically dense layer 190L, for example, by a spin-on coating. The second ARC layer 196L may comprise the same material as the ARC layer 70L in the first embodiment. The second ARC layer 196L may comprise the same material as, or a different material from, the material of the first ARC portions 180. The thickness of the second ARC layer may be from about 15 nm to about 300 nm, and typically from about 30 nm to about 150 nm, although lesser and greater thicknesses are also contemplated herein.

A second photoresist layer is applied and lithographically patterned, for example, by exposure and development, to form an array of the second photoresist portions 198. Preferably, the array of the second photoresist portions 198 has the same periodicity as the array of the first ARC portions 180, i.e., the pitch of the array of the second photoresist portions 198 is the lithographic pitch p, which is the pitch of the first pattern. The pattern of the array of the second photoresist portions 198, which is herein referred to as a second pattern, has the same pitch as the pitch of the first pattern, i.e., the lithographic pitch p. As in the patterning of the first photoresist layer 182L described above, overexposure or underexposure is preferably employed so that the width of each second photoresist portion 198 is less than one half of the lithographic pitch p.

Not necessarily but preferably, each of the second photoresist portions 198 has a width that is the same as the first width w1. Not necessarily but preferably, the first pattern and the second pattern are congruent and are offset by one half of the lithographic pitch p, i.e., p/2. If each of the second photoresist portions 198 has the same as the first width w1 and the first pattern and the second pattern are offset by one half of the lithographic pitch p, the pitch of a pattern to be formed in the underlying layer 66, which is a composite pattern of the first pattern and the second pattern as is subsequently described, is one half of the lithographic pitch p.

Figure 11:
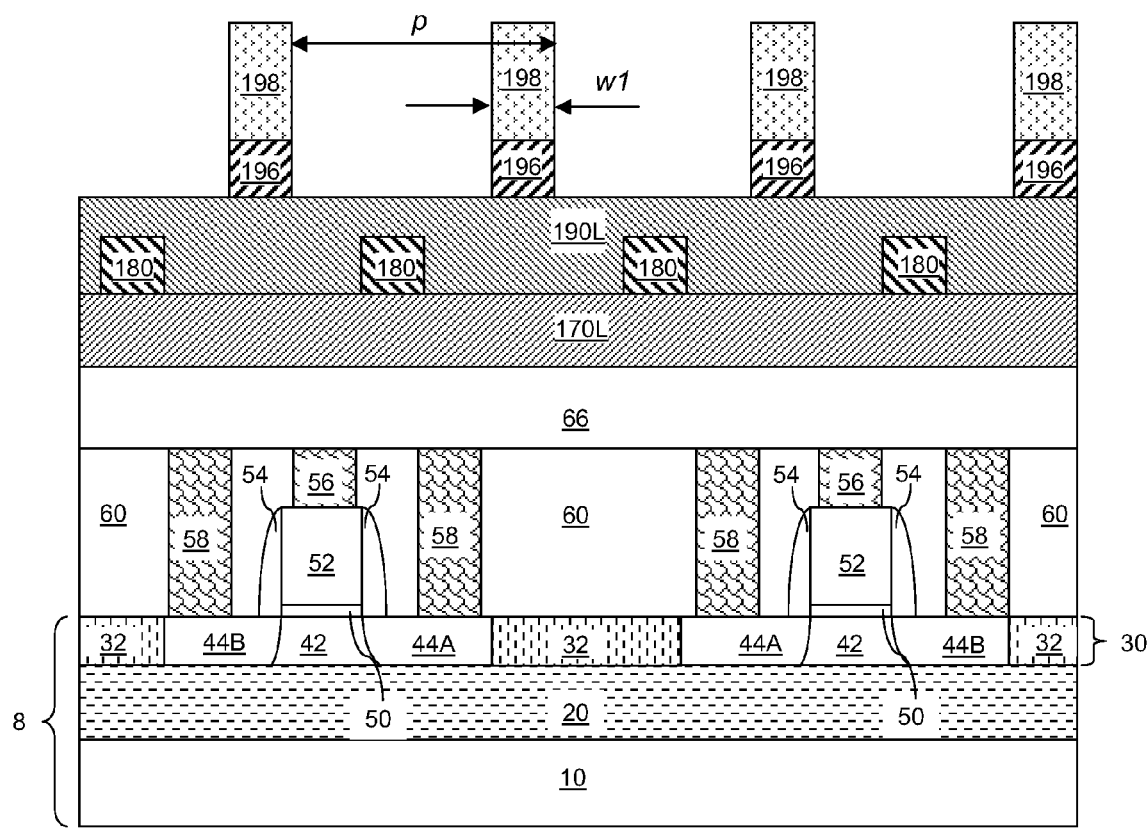

Referring to FIG. 11, the second pattern in the array of the second photoresist portions 198 is transferred into the second ARC layer 196 by an anisotropic etch, which is typically a reactive ion etch. The second pattern is thereby transferred into the second ARC layer 196L to form second ARC portions 196. Preferably, the anisotropic etch may, or may not, be selective to the second optically dense layer 190. The second ARC portions 196 collectively constitute another one-dimensional regular array having the lithographic pitch p. Preferably, the width of each of the second ARC portions 196 is substantially the same as the first width w1. Some or all of the second photoresist portions 198 may be removed during the formation of the array of the second ARC portions 198.

Figure 12:
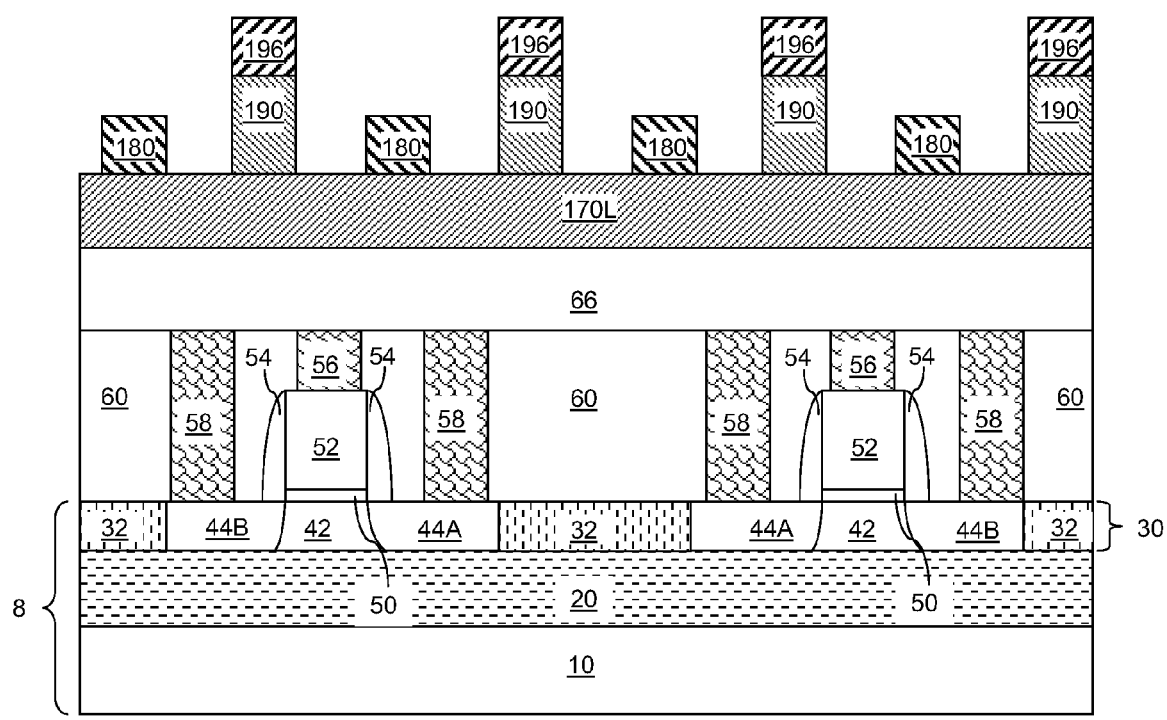

Referring to FIG. 12, the second pattern is transferred into the second optically dense layer 190L by an anisotropic etch to form an array of second optically dense portions 190. The anisotropic etch proceeds at least to the top surface of the first optically dense layer 170L so that each of the second optically dense portions 190 are separated from one another. The anisotropic etch is selective to the first ARC portions 180. The anisotropic etch may consume all or some of the array of the second photoresist portions 198.

The selectivity of the anisotropic etch to the first ARC portions 180 may take advantage of the differences in composition between the material of the first ARC portions 180 and the material of the second optically dense layer 170L. For example, silicon content or refractory metal content of the first ARC portions 180 may be leveraged in effecting an anisotropic etch that removed the material of the second optically dense layer 190L selective to the material of the first ARC portions 180.

Figure 13:
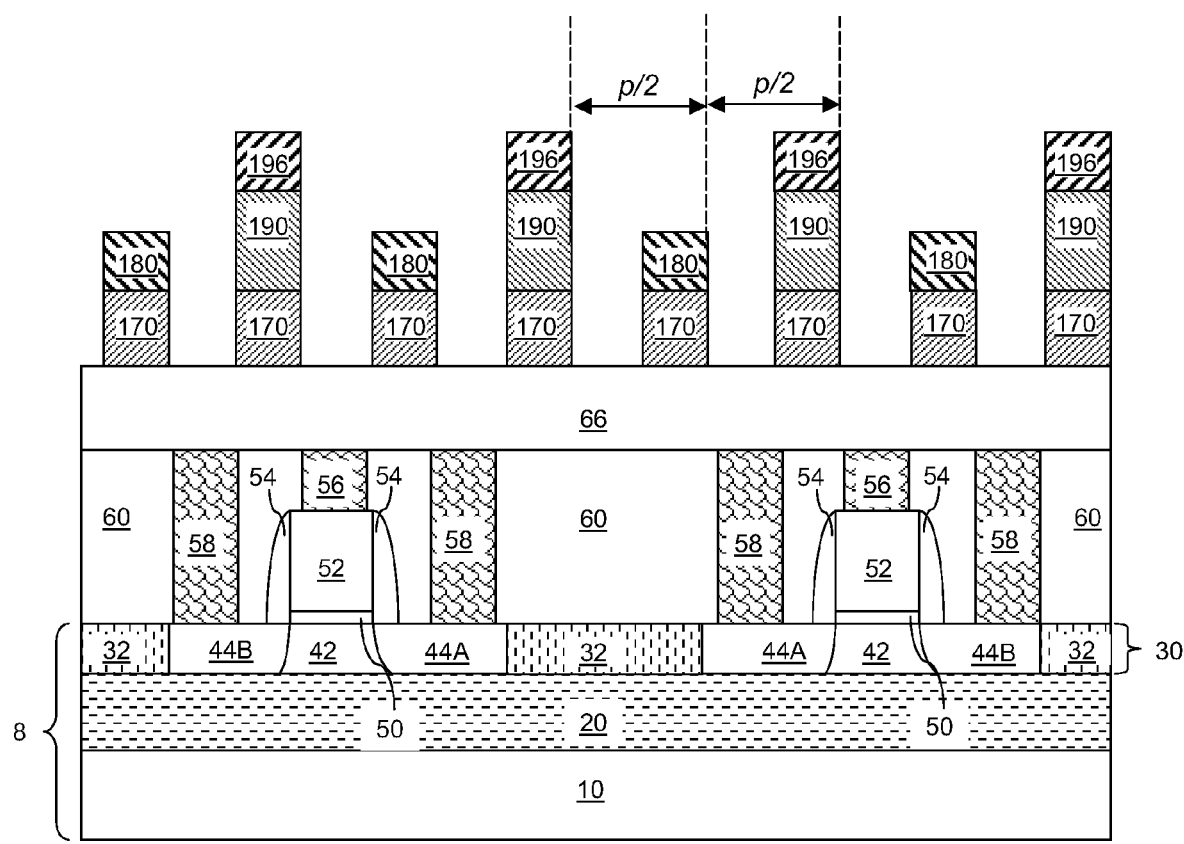

Referring to FIG. 13, the second pattern in the array of the second ARC portions 196 and the first pattern in the array of the first ARC portions 180 are simultaneously transferred into the first optically dense layer 170L to form an array of first optically dense portions 170. The pattern in the array of the first optically dense portions 170 is a composite pattern of the first pattern and the second pattern. In case each of the second photoresist portions 198 has the same as the first width w1 and the first pattern and the second pattern are offset by one half of the lithographic pitch p, the pattern in the array of first optically dense portions 170 has a pitch of one half of the lithographic pitch p. Typically, the array of the second photoresist portions 198 is completely consumed by the end of this step.

Figure 14:
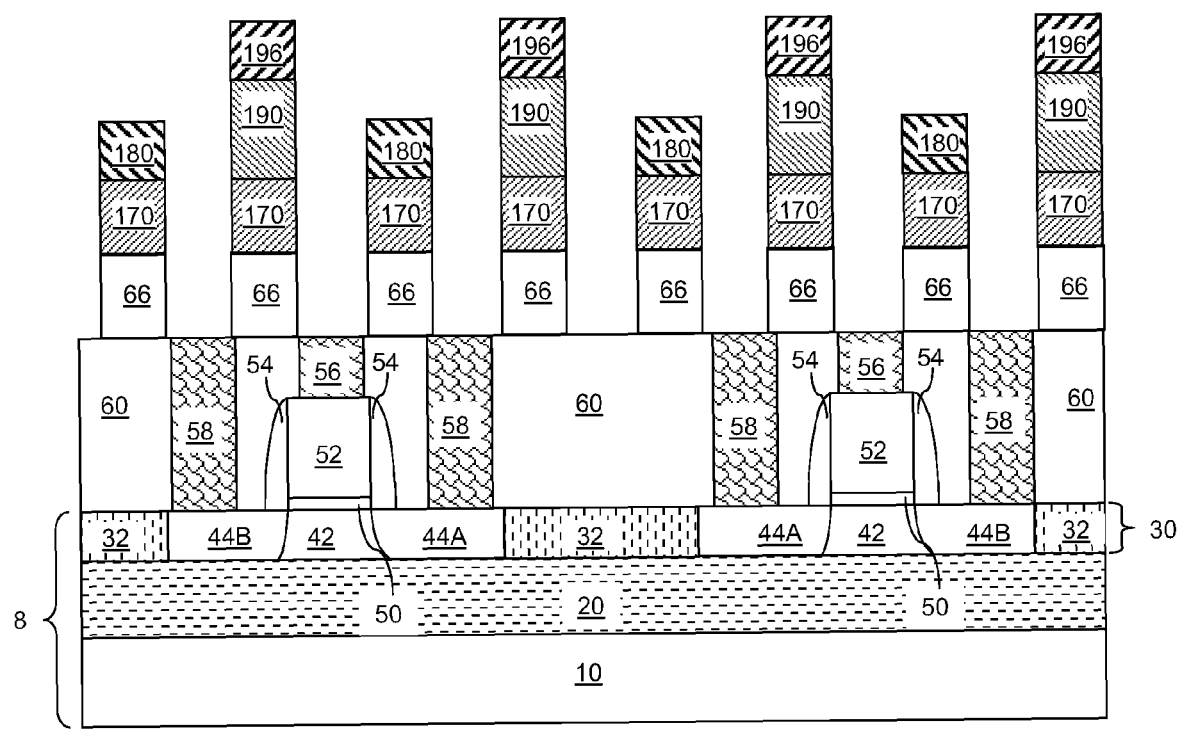

Referring to FIG. 14, the composite pattern in the array of the first optically dense portions 170 is transferred into the underlying layer 66 by an etch, which is typically an anisotropic etch. The chemistry of the etch depends on the material of the underlying layer 66. Preferably, the etch chemistry has selectivity to the optically dense portions 70. In one case, the array of the first ARC portions 180 and the array of the second ARC portions 196 may function as an etch mask throughout the anisotropic etch without being completely consumed. In another case, the array of the first ARC portions 180 and the array of the second ARC portions 196 may be completely or partly consumed and the array of the first optically dense portions 170 and/or the array of the second optically dense portions 190 may be employed as an etch mask.

After the anisotropic etch, the array of the first ARC portions 180, the array of the second ARC portions 196, the array of the first optically dense portions 170, and the array of the second optically dense portions 190 may be removed selective to the underlying layer 66. The patterned surfaces of the underlying layer 66 are exposed, which may have a periodicity of one half of the lithographic pitch p.

In case the pattern in the underlying layer 66 has a periodicity of one half of the lithographic pitch p, the pitch of the pattern in the underlying layer 66 may be sub-lithographic, i.e., less than a lithographic minimum pitch. For example, if the lithographic pitch p of the first photoresist portions 182 in FIG. 9 may be at least the lithographic minimum pitch and less than twice the lithographic minimum pitch, the pitch of the pattern in the underlying layer 66 is one half of the lithographic pitch p, which is less than the lithographic minimum pitch, i.e., a sub-lithographic pitch. Thus, a sub-lithographic pitch is obtained for the pattern in the underlying layer 66.

In case the width of the second photoresist portions 198 is different from the first width w1 or the offset between first pattern and the second pattern is not equal to one half of the lithographic pitch p, the pattern in the underlying layer 66 contains an alternating sequence of wide spaces and narrow spaces separated by lines and/or an alternating sequence of wide lines and narrow lines separated by spaces. The width of the wide lines, the width of the narrow lines, the width of the wide spaces, and/or the width of the narrow spaces may be sub-lithographic if the lithographic pitch p of the first photoresist portions 182 in FIG. 9 is at least the lithographic minimum pitch and less than twice the lithographic minimum pitch. Thus, a pattern having sub-lithographic features, i.e., features having dimensions that may not be printed by normal lithographic exposure and development processes, is formed in the underlying layer 66.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a patterned structure comprising:
   forming an optically dense layer including a hydrocarbon-based polymer on a substrate;
   applying and lithographically patterning a first photoresist on said optically dense layer;
   forming polymer spacers directly on sidewalls of said first photoresist and directly on a top surface of said optically dense layer after said lithographic patterning;
   removing said first photoresist selective to said polymer spacers; and
   transferring a pattern of said polymer spacers into said optically dense layer and an underlying layer on said substrate by at least one etch.

2. The method of claim 1, wherein said optically dense layer is formed directly on said underlying layer, and wherein said first photoresist is applied directly on said optically dense layer.

3. The method of claim 1, wherein said polymer spacers are fluorine-containing polymer spacers.

4. The method of claim 3, further comprising:
   conformally depositing a fluorine-containing polymer layer directly on said first photoresist; and
   forming said fluorine-containing polymer spacers by an anisotropic etch of said fluorine-containing polymer layer.

5. The method of claim 4, wherein an array of first photoresist portions having a lithographic pitch is formed by said lithographic patterning of said first photoresist.

6. The method of claim 5, wherein a lateral thickness of said fluorine-containing polymer layer on sidewalls of said first photoresist is less than one half of said lithographic pitch.

7. The method of claim 5, wherein said fluorine-containing polymer spacers have a sublithographic pitch which is equal to one half of said lithographic pitch.

8. The method of claim 4, wherein said anisotropic etch is selective to said first photoresist.

9. The method of claim 4, wherein said fluorine-containing polymer layer comprises fluorine at an atomic concentration from about 1% to about 50%, and wherein fluorine concentration in said first photoresist is less than 0.5%.

10. A method of forming a patterned structure comprising:
    forming an optically dense layer and a first stack of a first anti-reflective coating (ARC) layer and a first photoresist on a substrate;
    lithographically patterning said first photoresist with a first pattern and transferring said first pattern into said first ARC layer by an etch;
    forming a second stack of a second optically dense layer, a second ARC layer, and a second photoresist on said first ARC layer;
    lithographically patterning said second photoresist with a second pattern and transferring said second pattern into said second ARC layer and said second optically dense layer; and
    transferring said first pattern and said second pattern into an underlying layer on said substrate employing said first ARC layer and said second ARC layer as an etch mask.

11. The method of claim 10, wherein said optically dense layer is formed directly on said underlying layer, and wherein said first ARC layer is formed directly on said optically dense layer.

12. The method of claim 10, wherein said first pattern is a pattern of a periodic array having a lithographic pitch.

13. The method of claim 12, wherein said second pattern is a pattern of another periodic array having said lithographic pitch.

14. The method of claim 13, wherein said underlying layer is patterned with a composite pattern of said first array and said second array, wherein said composite pattern has a pitch that is one half of said lithographic pitch.

15. The method of claim 14, wherein said pitch of said composite pattern is a sublithographic pitch.

16. The method of claim 13, wherein said first pattern and said second pattern are congruent and are offset relative to each other by one half of said lithographic pitch.

17. The method of claim 10, further comprising removing said first photoresist prior to said formation of said second stack.

18. The method of claim 10, wherein said second optically dense layer is self-planarizing and covers an entirety of said first ARC layer having said first pattern.

19. A structure comprising:
    an optically dense layer including a hydrocarbon-based polymer and located on a substrate; and
    an array of polymer spacers located directly on a top surface of said optically dense layer and having a sublithographic pitch, wherein twice said sublithographic pitch is a lithographic pitch.

20. The structure of claim 19, further comprising an array of patterned photoresist portions having said lithographic pitch.

21. The structure of claim 19, wherein a top surface of said optically dense layer is exposed between each pair of neighboring polymer spacers.

22. A structure comprising:
    an optically dense layer located on a substrate;
    a first array of first anti-reflective coating (ARC) portions having a lithographic pitch and abutting a top surface of said optically dense layer; and
    a second array of stacks having said lithographic pitch and interlaced with said first array, wherein each of said stacks comprises a second ARC portion abutting said optically dense layer and an optically dense portion abutting a top surface of said second ARC portion.

23. The structure of claim 22, wherein said first array and said second array are offset by one half of said lithographic pitch.

24. The structure of claim 23, wherein each neighboring pair of said first ARC portions and said second ARC portions are laterally separated by a sublithographic pitch which is the same as said one half of said lithographic pitch.

25. The method of claim 1, wherein said top surface of said optically dense layer is exposed between each adjacent pair of polymer spacers after said removing of said first photoresist selective to said polymer spacers.

* * * * *